United States Patent [19]

Martin et al.

[11] Patent Number: 5,022,862
[45] Date of Patent: Jun. 11, 1991

[54] MODULAR CONNECTOR

[75] Inventors: Jean-Paul Martin, St. Pierre du Perray; Guy Kolozsvari, Verrieres-le-Buisson, both of France

[73] Assignee: Societe C E T R A, Ste Genevieve des Bois, France

[21] Appl. No.: 481,666

[22] Filed: Feb. 14, 1990

Related U.S. Application Data

[63] Continuation-in-part of Ser. No. 118,581, Nov. 6, 1987, abandoned.

[30] Foreign Application Priority Data

Nov. 12, 1986 [FR] France ............... 86 15970

[51] Int. Cl.$^5$ ........................... H01R 9/09
[52] U.S. Cl. ..................... 439/83; 29/842; 361/396; 361/413; 439/717
[58] Field of Search ............ 439/55, 83, 717, 715, 439/709; 29/830, 831, 839, 840, 842-844, 846; 361/413, 396, 393, 394, 406, 407, 417, 419, 420, 426

[56] References Cited

U.S. PATENT DOCUMENTS

| | | | |
|---|---|---|---|
| 4,060,295 | 11/1977 | Tomkiewicz | 439/55 |
| 4,424,251 | 1/1984 | Sugishita et al. | 361/410 |
| 4,516,188 | 5/1985 | Kessler | 439/83 |
| 4,583,807 | 4/1986 | Kaufman et al. | 439/83 |
| 4,621,880 | 11/1986 | Rush | 439/83 |
| 4,629,278 | 12/1986 | Norton et al. | 439/83 |
| 4,641,426 | 2/1987 | Hartman et al. | 439/717 |
| 4,693,532 | 9/1987 | Colleran et al. | 439/717 |
| 4,695,106 | 9/1987 | Feldman et al. | 439/83 |
| 4,732,565 | 3/1988 | Ito et al. | 439/83 |

*Primary Examiner*—Paula A. Bradley
*Attorney, Agent, or Firm*—Herbert Dubno

[57] ABSTRACT

Connector formed by the juxtapositioning of modules whose bases (1a, 1b, 1c) have dimensions similar to those of a surface mounted component, so as to be able to gripped and positioned by the same machine, and have connecting elements passing therethrough with one of their ends bent back under the base, characterized in that the modules are not mechanically fixed to each other and held solely by soldering the bent back ends (5b) of the connecting elements on tracks (6) of a printed circuit (7).

5 Claims, 4 Drawing Sheets

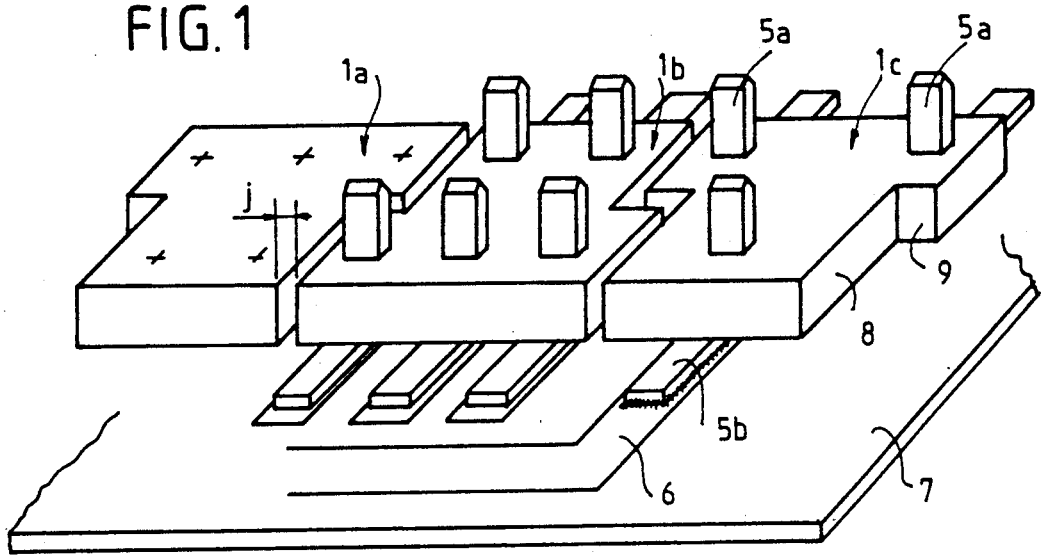
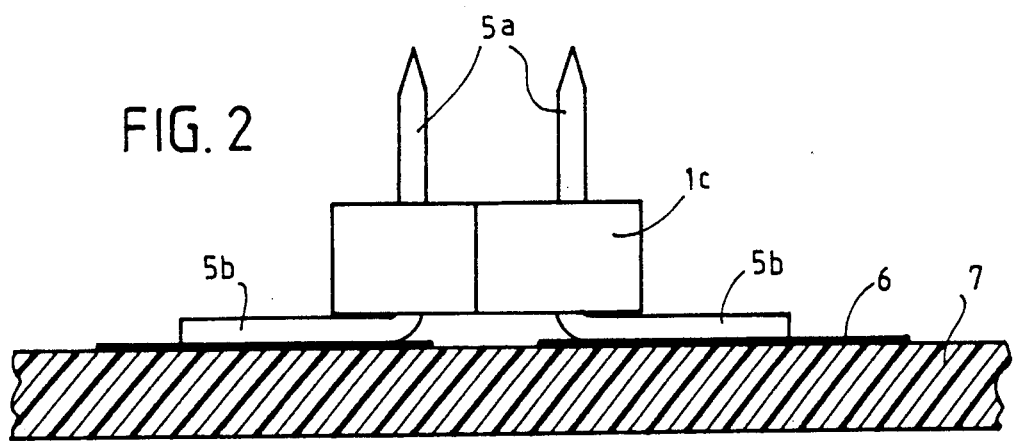
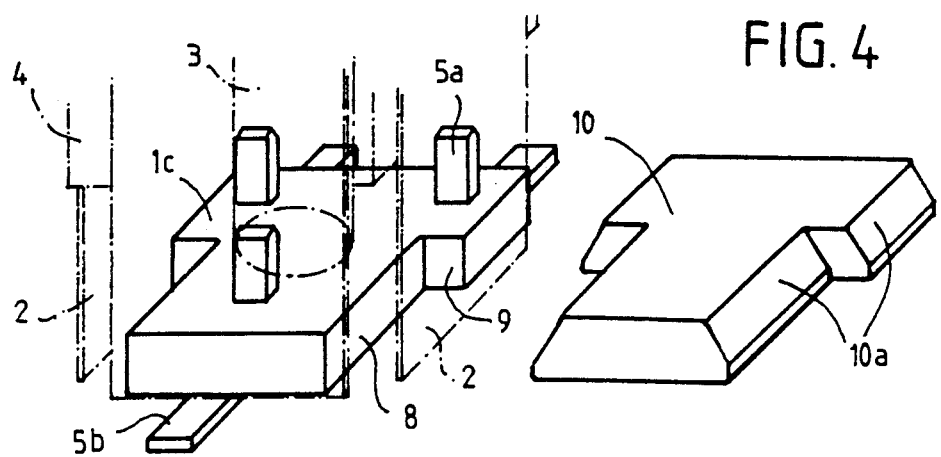

MODULAR CONNECTOR

CROSS REFERENCE TO RELATED APPLICATION

This application is a continuation-in-part of serial number 07/118,581 filed Nov. 6, 1987 and since abandoned.

FIELD OF THE INVENTION

The present invention provides a connector which is in particular suitable for circuits using surface mounted or SMC components.

BACKGROUND OF THE INVENTION

Until recently, the interconnection of printed circuit boards was provided by connectors having n contacts called "soldering pins". This method required the provision of solder inserts in the connecting tracks and holes bored in the board in line with the inserts, which appreciably increased the cost price of the board. The problems raised by this connection were aggravated by the arrival on the market of surface mounted components or SMC components which are minature and require the use of boards, tracks and connectors which are also miniaturized.

BRIEF DESCRIPTION OF THE INVENTION

The connector of the invention is formed by the juxta-positioning of modules whose bases have dimensions similar to those of a component so as to be able to be gripped and positioned by the same conditioning machine, and have connecting elements passing therethrough with one of their ends bent back under the base. According to the invention, the modules are not mechanically fixed to each other but are held solely by soldering the bent back ends of the connecting elements on the tracks of a printed circuit.

Preferably, the side edges of each base include a setback.

According to a feature of the invention, the modular connector of the invention comprises:

an electrically insulating block having upper and lower faces of T-shaped outline defining the shank of the respective T-shaped module and the crossbar of the respective T-shaped module perpendicular to the respective shank, the shank and ends of the crossbar of the block having beveled flanks commencing at a location spaced from one of the faces and extending inwardly to terminate at the other of the faces, the beveled flanks of the block being juxtaposed with and complementary to the beveled flanks of the blocks of adjacent modules; and A plurality of electrically conductive contact elements extending through the respective block, projecting in mutually parallel spaced relationship from an upwardly turned one of the faces of the respective block, and bent portions lying along a downwardly turned one of the faces of the respective block and soldered to the tracks as exclusive means for anchoring the modules to the printed circuit, each block having, being the respective beveled flanks and the face of the block from which the beveled flanks are spaced, mutually parallel flanks on opposite sides of the body for gripping by a machine for automatically mounting the modules on the printed circuit.

The invention also provides a method for constructing a connector using modules whose base has dimensions similar to those of a surface mounted component and has passing therethrough connecting elements with one of their ends bent back under the base. These modules are positioned individually on a printed circuit, side by side, with a certain clearance so as to from the desired connector and in that these modules are fixed to the base by soldering the bent ends of the connecting elements on tracks of the printed circuit.

BRIEF DESCRIPTION OF THE DRAWING

The above and other objects, features and advantages of my invention will become more readily apparent from the following description, reference being made to the accompanying highly diagrammatic drawing in which:

FIG. 1 is a perspective view of the connector soldered to a printed circuit board;

FIG. 2 is a side view thereof;

FIG. 3 is a perspective view showing the picking up of a module;

FIG. 4 is a perspective view of a module variant;

SPECIFIC DESCRIPTION

Figure 5:
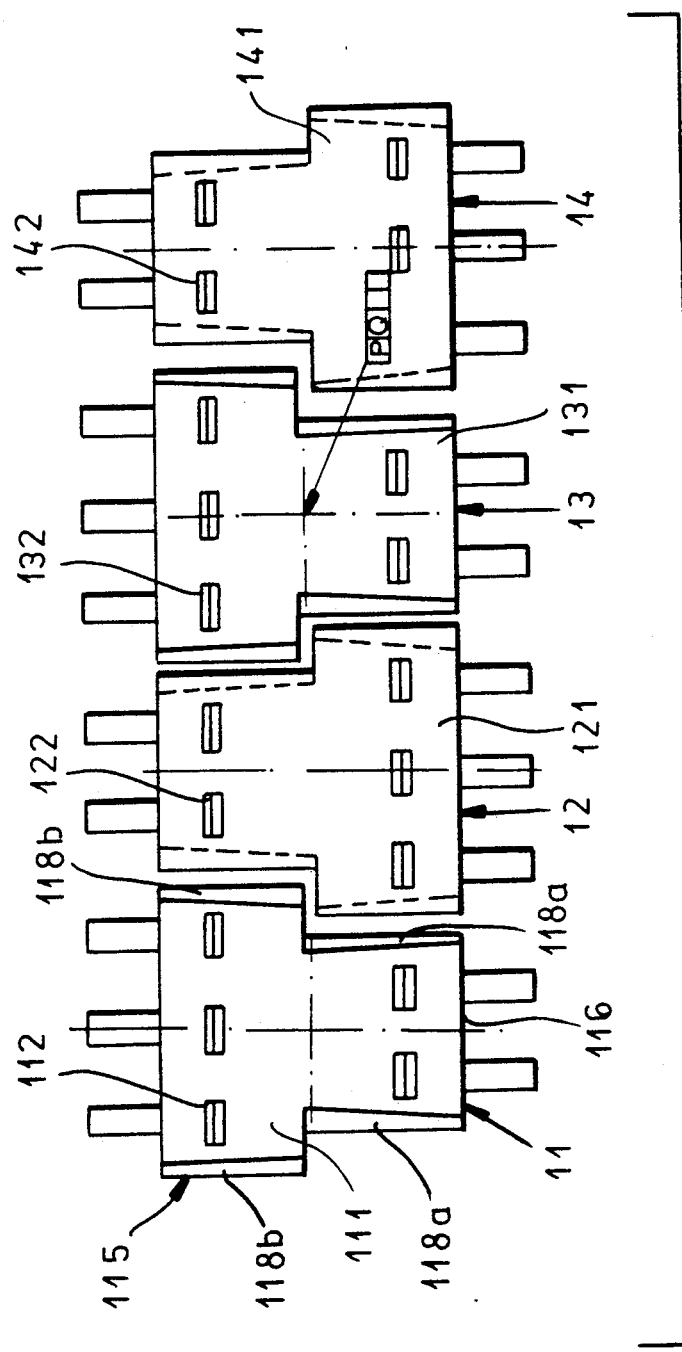
FIG. 5 is a plan view illustrating the arrangement of modules of a connector according to the invention with an exaggerated spacing between them to show the flanks of the modules, it being understood that the flanks of adjoing modules are in contact with one another so as to insure alignment of each subsequently added module with a previously applied module.

As shown in FIGS. 1 and 2 of the drawing, the connector of the invention is formed of two or more juxtaposed modules, three in number in the drawing, each having a base $1a$, $1b$ or $1c$ whose dimensions are similar to those of the surface mounted electronic components so that they may be gripped and positioned by the same machine, as shown in FIG. 3 where the centering fingers 2 and nozzle 3 carried by the head of the machine can be seen, the nozzle being applied to the center of the base.

The base of each of these modules has a number of connecting elements passing therethrough. One $5a$ of the ends of each of these elements extends upwardly, perpendicularly to the plane of the base, and forms a male or female connecting pin; the other end $5b$ is bent back under the base and may thus be soldered to a track 6 of a printed circuit 7. These connecting elements are disposed in two rows or more, in a staggered relationship, at the desired pitch.

The different modules are spaced apart from each other by a clerarance j determined as a function of the pitch of the connecting elements and compatible with the positioning accuracy of the machines and of the capacity for compensating the contacts of the receptacle or plug cooperating with the connector.

The side edges of each base have respective set-backs forming shoulders 9.

In the embodiment shown in FIG. 4, the module has a base 10 whose side faces such as $10a$ are sloped over the greatest pat of their height, the base thus being practically in the form of a truncated pyramid. In the drawing, the widest part of the base is situated on the same side as the bent back parts 5b. During construction of the connector the modules of the first type are positioned first of all and then of the second type inserted therebetween, which takes up the greatest part of the clearance.

The embodiment of FIG. 4 is, of course, substantially similar to the modules of FIGS. 5 through 8 which show the contact pins omitted in the module of FIG. 4. FIGS. 5 to 8, in addition, demonstrate that the bevel or inclined flank can change in slope from the end of the respective module toward the junction of the shank and cross bar thereof or from the end of the module inwardly.

Turning first to FIG. 5, it will be seen that the connector as a whole can comprise a plurality of modules which are here represented at 11, 12, 13 and 14, respectively.

Each of these modules comprises an insulating body 111, 121, 131, 141, respectively having connecting elements 112, 122, 132 and 142, respectively. These connecting elements, as is apparent from FIG. 6, have upwardly projecting parallel portions 112a, for example, and bent portions 112b analogous to the bent portions 5b previously described. For example, in FIG. 7, the module 11 is shown to have the projecting portions 112a extending upwardly and the bent portions 112b extending horizontally and soldered to the conductor tracks 6 of the printed circuit 7.

Each of the insulating bodies 111, 112, 113, 114 is of generally T-shaped outline and has an upper surface 113, for example, and a lower surface 114 which are parallel to one another, planar and of T-shaped outline.

The T configuration defines a cross bar, 115 for example, extending perpendicularly to a shank 116.

Figure 8:
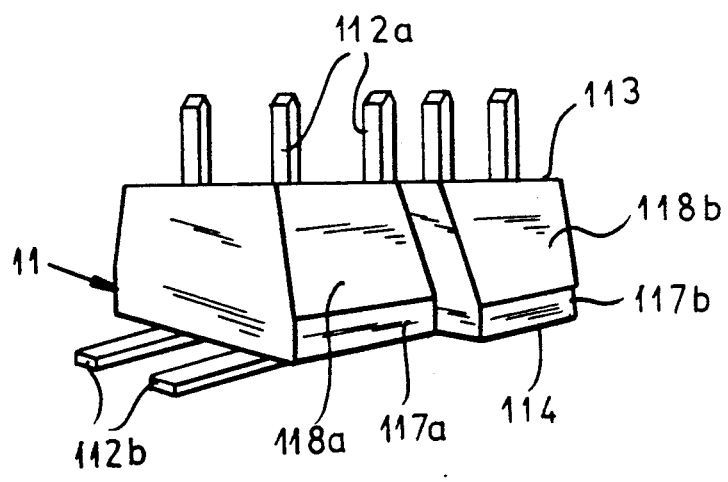
FIG. 8 is a perspective view of one of these modules.

Along the sides of each module adapted to adjoin other modules, bevelled flanks 118a and 118b are provided and extend from a location spaced from one of the surfaces, e.g. the surface 114 as seen in FIG. 8, to the opposite surface, e.g. the surface 113 as illustrated in this FIG.

As a consequence, between each bevelled flank and the surface 114 from which it is spaced, parallel flanks 117a and 117b are provided.

While the inclination of the bevelled flank for the module of FIG. 4 is constant over the entire length of the bevelled flank, in the embodiment of FIGS. 5 to 8, the bevelled flank has an increasing inclination. For example, the bevelled flank 118a has a shallower inclination from the vertical at the end of the shank and progressively increases in its angle to the vertical toward the cross bar. Similarly, the bevelled flank 118b increases in inclination from the end of the cross bar towards the junction or step at which the shank adjoins the cross bar.

Figure 6:
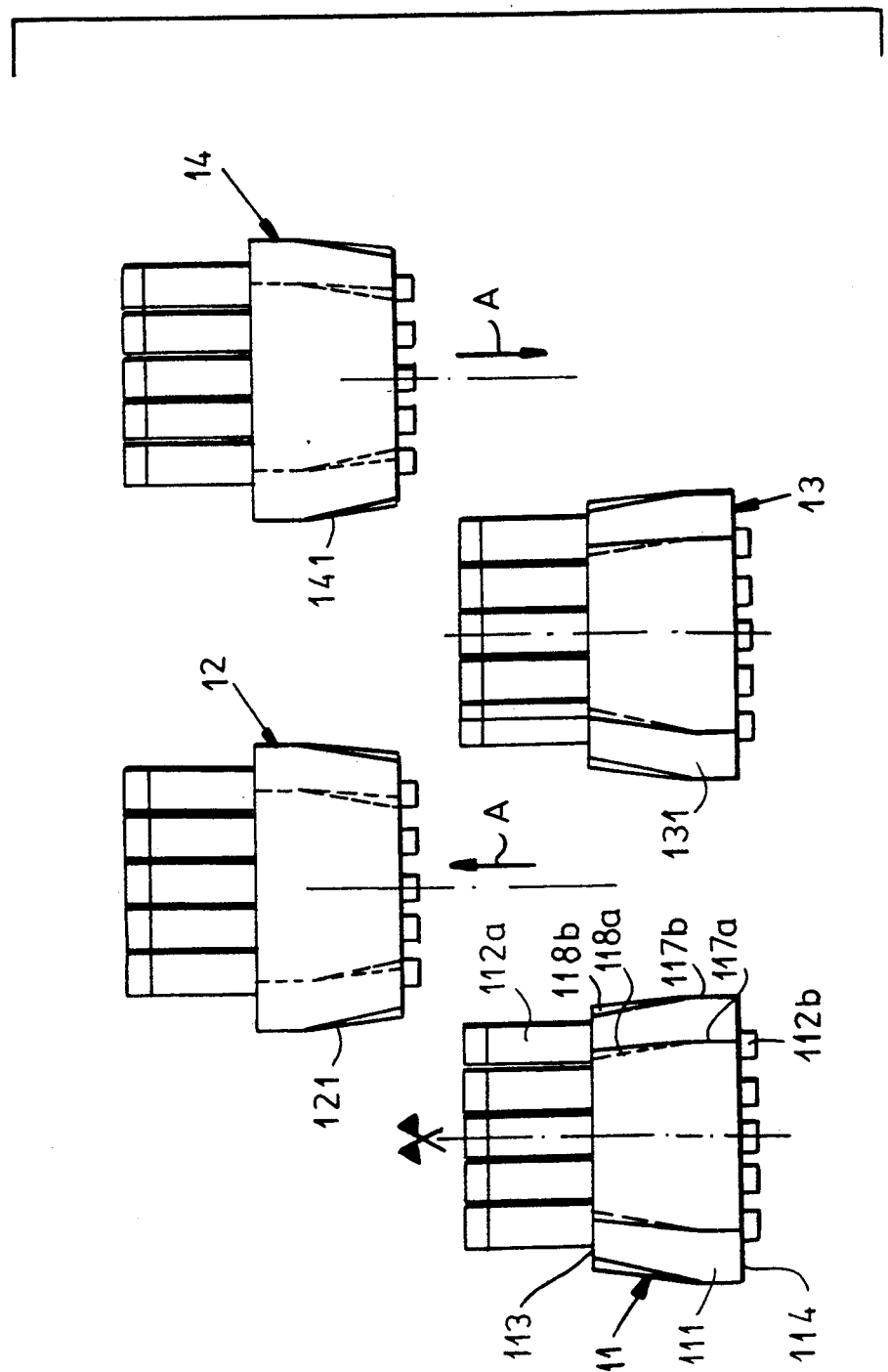
FIG. 6 is a diagram illustrating how the modules are nested together.
Figure 7:
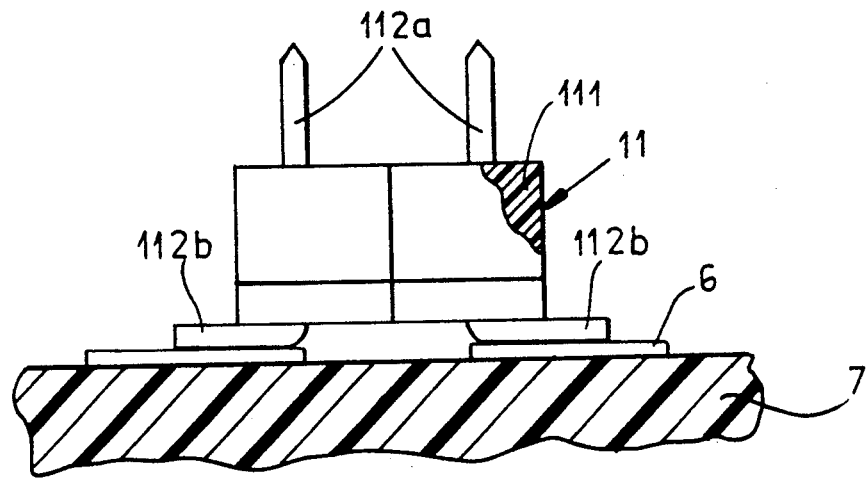
FIG. 7 is a side view of one of the modules of FIGS. 5 and 6.

Turning now to FIGS. 5 and 6, it can be seen that the bodies 121 and 141 of the modules 12 and 14 are mirror symmetrical in configuration to the bodies 111 and 131 of the modules 11 and 13 and are rotated through 180° about a vertical axis with respect to the modules 11 and 13 for insertion of the modules 12 and 14 against the modules 12 and 13 as represented by the arrows A in FIG. 6.

The parallel flanks 117a and 117b allow the module to be engaged (gripped) by a manipulator or other positioning robot as has been described in connection with FIGS. 1 to 4 and positioned on the printed circuit beyond and adjacent other modules so that the bevelled flanks of adjoining modules will lie adjacent one another and precisely position the subsequent applied modules. As in the embodiment of FIGS. 1 to 3, each shank of a module can be positioned between the ends of the cross bars of two adjoining modules and the cross bar of that module can be flanked by the shanks of the adjoining modules (see FIG. 5).

We claim:

1. A connector for printed circuit having conductive tracks, said connector comprising a plurality of T-shaped modules interfitted so that a crossbar of one T-shaped module fits between shanks of two other T-shaped modules flanking said one T-shaped module and crossbars of said other T-shaped modules flank a shank of said one T-shaped module, each of said modules comprising:

an electrically insulating block having upper and lower faces of T-shaped outline defining the shank of the respective T-shaped module and the crossbar of the respective T-shaped module perpendicular to the respective shank, and shank and ends of the crossbar of said block having beveled flanks commencing at a location spaced from one of said faces and extending inwardly to terminate at the other of said faces, the beveled flanks of said block being juxtaposed with and complementary to the beveled flanks of the blocks of adjacent modules; and a plurality of electrically conductive contact elements extending through the respective block, projecting in mutually parallel spaced relationship from an upwardly turned one of said faces of the respective block, and bent portions lying along a downwardly turned one of said faces of the respective block and soldered to said tracks as exclusive means for anchoring said modules to said printed circuit, each block having, between the respective beveled flanks and the face of the block from which the beveled flanks are spaced, mutually parallel flanks on opposite sides of the body for gripping by a machine for automatically mounting said modules on said printed circuit.

2. The connector defined in claim 1 wherein said beveled flanks have inclinations which vary inwardly from ends of said shanks and crossbars respectively.

3. The connector defined in claim 1 wherein the blocks of adjacent modules have mirror-symmetrical shapes.

4. The connector defined in claim 1 wherein said beveled flanks have greater heights than said parallel flanks.

5. A method of forming a connector for a printed circuit board having conductive tracks thereon, comprising the steps of:

(a) forming a plurality of connector modules with generally flat bodies having lateral steps formed therein and a plurality of connecting elements traversing each body and projecting from one side thereof and having ends bent along an opposite side of each body to lie along a flat surface of each body and projecting beyond an outline thereof and constituting said bodies of two types, in one of said types lateral edges being beveled in one direction to constitute of said flat surface a narrow surface of the body and in another of said types of lateral edges being beveled complementarily to constitute of said flat surface thereof a wide surface of the body;

(b) seizing each module in succession and automatically positioning each module upon said printed circuitboard so that the respective ends overlie respective tracks of said printed circuit board and successive modules are interfitted with previously positioned modules with a predetermined spacing therebetween and bodies of the two types alternate with one another in a row with complementarily beveled edges in contact with one another; and (c) securing said modules individually to said printed circuit board without mechanically interconnecting said modules to said printed circuit board solely by soldering said ends to said tracks.

* * * * *